US008373280B2

(12) United States Patent
Harada et al.

(10) Patent No.: US 8,373,280 B2
(45) Date of Patent: Feb. 12, 2013

(54) MANUFACTURING FIXTURE FOR A RAMP-STACK CHIP PACKAGE USING SOLDER FOR COUPLING A RAMP COMPONENT

(75) Inventors: John A. Harada, Mountain View, CA (US); Robert J. Drost, Los Altos, CA (US); David C. Douglas, Palo Alto, CA (US)

(73) Assignee: Oracle America, Inc., Redwood Shores, CA (US)

( * ) Notice: Subject to any disclaimer, the term of this patent is extended or adjusted under 35 U.S.C. 154(b) by 231 days.

(21) Appl. No.: 12/873,945

(22) Filed: Sep. 1, 2010

(65) Prior Publication Data

US 2012/0049376 A1   Mar. 1, 2012

(51) Int. Cl.
*H01L 23/498* (2006.01)
*H01L 21/50* (2006.01)
(52) U.S. Cl. ......... 257/777; 257/E23.069; 257/E21.499; 257/773; 257/686; 257/723; 257/724; 257/728; 257/778; 257/737; 257/738
(58) Field of Classification Search ................ 257/773, 257/E23.068, E21.499, 777, 723, 724, 728, 257/685, 686, 737, 734, 738, 778; 438/107
See application file for complete search history.

(56) References Cited

U.S. PATENT DOCUMENTS

| 6,376,904 | B1 * | 4/2002 | Haba et al. ................ 257/686 |
| 7,420,269 | B2 * | 9/2008 | Ha et al. .................... 257/686 |
| 7,732,908 | B2 * | 6/2010 | Nishiyama et al. ........... 257/686 |
| 7,832,818 | B1 * | 11/2010 | McElfresh ................... 347/5 |
| 2007/0170573 | A1 * | 7/2007 | Kuroda et al. ............... 257/686 |
| 2008/0174030 | A1 * | 7/2008 | Liu et al. .................... 257/777 |

(Continued)

FOREIGN PATENT DOCUMENTS

| EP | 1028463 A1 | 8/2000 |
| EP | 2001036309 | 9/2001 |

(Continued)

OTHER PUBLICATIONS

O'Reilly, Mike et al., "Jetting Your Way to Fine-pitch 3D Interconnects", Chip Scale Review, Sep./Oct. 2010, pp. 18-21, chipscalereview.com.

(Continued)

*Primary Examiner* — A O Williams
(74) *Attorney, Agent, or Firm* — Park, Vaughan, Fleming & Dowler LLP; Steven E Stupp

(57) ABSTRACT

An assembly component and a technique for assembling a chip package using the assembly component are described. This chip package includes a set of semiconductor dies that are arranged in a stack in a vertical direction, which are offset from each other in a horizontal direction to define a stepped terraced at one side of the vertical stack. Moreover, the chip package may be assembled using the assembly component. In particular, the assembly component may include a housing having another stepped terrace. This other stepped terrace may include a sequence of steps in the vertical direction, which are offset from each other in the horizontal direction. Furthermore, the housing may be configured to mate with the set of semiconductor dies such that the set of semiconductor dies are arranged in the stack in the vertical direction. For example, the other stepped terrace may approximately be a mirror image of the stepped terrace.

20 Claims, 6 Drawing Sheets

U.S. PATENT DOCUMENTS

| | | | |
|---|---|---|---|
| 2008/0303131 A1* | 12/2008 | McElrea et al. | 257/686 |
| 2009/0085222 A1* | 4/2009 | Yamano | 257/777 |
| 2009/0085223 A1* | 4/2009 | Nishiyama et al. | 257/777 |
| 2009/0321954 A1 | 12/2009 | Oh | |
| 2010/0193930 A1* | 8/2010 | Lee | 257/686 |
| 2011/0018120 A1* | 1/2011 | Drost et al. | 257/692 |
| 2011/0062596 A1* | 3/2011 | Murayama et al. | 257/777 |
| 2011/0200976 A1* | 8/2011 | Hou et al. | 434/267 |
| 2012/0051695 A1* | 3/2012 | Harada et al. | 385/39 |

FOREIGN PATENT DOCUMENTS

| | | |
|---|---|---|
| JP | 200136309 A | 9/2001 |
| WO | 9940627 A1 | 8/1999 |

OTHER PUBLICATIONS

Smith, Donald L. et al., "Flip-Chip Bonding on 6-um Pitch using Thin-Film Microspring Technology", Published in Proc. 48th Electronic Components and Technology Conf: Seattle, Washington, May 1998.

Saito, Mitsuko et al., "A 2Gb/s 1.8pJ/b/chip Inductive-Coupling Through-Chip Bus for 128-Die NAND-Flash Memory Stacking", ISSCC 2010 / Session 24/ Dram & Flash Memories / 24.5, 2010, pp. 440-442.

Kang, Uksong et al., "8 Gb 3-D DDR3 DRAM Using Through-Silicon-Via Technology", IEEE Journal of Solid-State Circuits, vol. 45, No. 1, Jan. 2010, pp. 111-119.

Schuylenbergh, Koenraad Van et al., "On-Chip Out-of-Plane High-Q Inductors", IEEE 2002, pp. 364-373.

\* cited by examiner

US 8,373,280 B2

MANUFACTURING FIXTURE FOR A RAMP-STACK CHIP PACKAGE USING SOLDER FOR COUPLING A RAMP COMPONENT

BACKGROUND

1. Field

The present disclosure generally relates to the process of manufacturing a semiconductor chip package. More specifically, the present disclosure relates to an assembly component and a technique for assembling the chip package, which includes a group of chips arranged in a stack, and a ramp component that is at an angle relative to the stack.

2. Related Art

Chip packages that include stacked semiconductor chips or dies can provide significantly higher performance in comparison to conventional individually packaged chips that are connected to a printed circuit board. These chip packages also provide certain advantages, such as the ability: to use different processes on different chips in the stack, to combine higher density logic and memory, and to transfer data using less power. For example, a stack of chips that implements a dynamic random access memory (DRAM) can use a high-metal-layer-count, high-performance logic process in a base chip to implement input/output (I/O) and controller functions, and a set of lower metal-layer-count, DRAM-specialized processed chips can be used for the rest of the stack. In this way the combined set of chips may have better performance and lower cost than: a single chip that includes I/O and controller functions manufactured using the DRAM process; a single chip that includes memory circuits manufactured using a logic process; and/or attempting to use a single process to make both logic and memory physical structures.

However, it can be difficult to assemble chip packages that include stacked semiconductor chips. In particular, existing assembly techniques may be time-consuming and may have low yields (which may increase the cost of the chip package). For example, in many existing assembly techniques the total vertical position error over the stack of semiconductor chips is the sum of the vertical position errors associated with each of the semiconductor chips. As a consequence, the total vertical position error for stacks that include multiple semiconductor chips can become prohibitively large. This may result in tight manufacturing tolerances to reduce the individual vertical position errors (which can increase the cost of the semiconductor dies) and/or may constrain the number of semiconductor chips that can be assembled in a stack (which may limit performance).

Hence, what is needed is a technique for assembling a stack of chips without the problems described above.

SUMMARY

One embodiment of the present disclosure provides an assembly component that includes a housing having a first stepped terrace. This first stepped terrace includes a sequence of steps in a vertical direction, where each step after a first step in the sequence of steps is offset in a horizontal direction by a first offset value from an immediately preceding step in the sequence of steps. Furthermore, the housing is configured to mate with a set of semiconductor dies such that the set of semiconductor dies are arranged in a stack in the vertical direction, which is substantially perpendicular to a first semiconductor die in the vertical stack. Additionally, each semiconductor die, after the first semiconductor die, is offset in a horizontal direction by a second offset value from an immediately preceding semiconductor die in the vertical stack, thereby defining a second stepped terrace at one side of the vertical stack.

This assembly component may facilitate assembly of a chip package in which: a ramp component is rigidly mechanically coupled to the semiconductor dies; the ramp component is positioned on one side of the vertical stack; and the ramp component is approximately parallel to a direction along the second stepped terrace, which is between the horizontal direction and the vertical direction. For example, to facilitate assembly the first stepped terrace may approximately be a mirror image of the second stepped terrace. Furthermore, a given semiconductor die in the set of semiconductor dies may have a nominal thickness, and a vertical displacement of a given step in the sequence of steps may be larger than the nominal thickness. Additionally, the first offset value may be the same as or larger than the second offset value.

Note that the first offset value and the second offset value may be determined based on the direction and a nominal thickness of solder used to rigidly mechanically couple the ramp component to the set of semiconductor dies.

In some embodiments, the assembly component facilitates assembly of the set of semiconductor dies with an accumulated position error over the set of semiconductor dies in the vertical direction that is less than a sum of vertical errors associated with the set of semiconductor dies and a set of adhesive layers between the semiconductor dies. For example, the accumulated position error may be associated with: thickness variation of the semiconductor dies, thickness variation of the set of adhesive layers; and/or thickness variation of a heat-spreading material in the set of adhesive layers. Additionally, the assembly component may facilitate assembly of the set of semiconductor dies with a maximum position error of the semiconductor dies associated with edge variation of the semiconductor dies that is less than a predefined value.

Another embodiment provides a method for assembling a chip package using the assembly component. During this method, an edge of a first semiconductor die in the vertical stack of semiconductor dies is positioned proximate to the first step in the sequence of steps in the first stepped terrace in the vertical direction of the housing. Note that the vertical direction is substantially perpendicular to the first semiconductor die. Then, an adhesive layer is applied to a top surface of the first semiconductor die. Moreover, an edge of a second semiconductor die in the vertical stack of semiconductor dies is positioned proximate to a second step in the sequence of steps in the vertical direction of the housing. Next, a bottom surface of the second semiconductor die is mechanically coupled to the adhesive layer, where the second step is offset in the horizontal direction by the first offset value from the first step, and where the second semiconductor die is offset in the horizontal direction by the second offset value, thereby defining the second stepped terrace at one side of the vertical stack. Furthermore, the ramp component is rigidly mechanically coupled to the first semiconductor die and the second semiconductor die, where the ramp component is positioned on the one side of the vertical stack, and where the ramp component is approximately parallel to the direction along the second stepped terrace, which is between the horizontal direction and the vertical direction.

Note that positioning a given semiconductor die, which can be one of the first semiconductor die and the second semiconductor die, may involve a pick-and-place tool. Furthermore, this positioning may be based on optical alignment markers on the given semiconductor die.

In some embodiments, the adhesive layer includes a heat-spreading material that preferentially conducts heat in a plane of a given semiconductor die.

Additionally, rigidly mechanically coupling the ramp component to the first semiconductor die and the second semiconductor die may involve melting or reflowing solder on: the ramp component and/or the first semiconductor die and the second semiconductor die. Note that when rigidly mechanically coupling the ramp component to the first semiconductor die and the second semiconductor die, a compressive force may be applied in the vertical direction.

Another embodiment provides a method for assembling a chip package without using the assembly component. During this method, the first semiconductor die is positioned in the vertical stack of semiconductor dies, where the vertical stack is along the vertical direction that is substantially perpendicular to the first semiconductor die. Then, the adhesive layer is applied to the top surface of the first semiconductor die. Moreover, the edge of the second semiconductor die in the vertical stack of semiconductor dies is positioned relative to the first semiconductor die, where the bottom surface of the second semiconductor die is mechanically coupled to the adhesive layer, and where the second semiconductor die is offset in the horizontal direction by the offset value, thereby defining a stepped terrace at one side of the vertical stack. Furthermore, the ramp component is rigidly mechanically coupled to the first semiconductor die and the second semiconductor die, where the ramp component is positioned on the one side of the vertical stack, and wherein the ramp component is approximately parallel to a direction along the stepped terrace, which is between the horizontal direction and the vertical direction.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of an assembly component, a method for assembling a chip package using the assembly component, and another method for assembling the chip package without the assembly component are described. This chip package includes a set of semiconductor dies that are arranged in a stack in a vertical direction, which are offset from each other in a horizontal direction to define a stepped terraced at one side of the vertical stack. Moreover, the chip package includes a ramp component positioned on the one side of the vertical stack, which is approximately parallel to a direction along the stepped terrace. This chip package may be assembled using the assembly component. In particular, the assembly component may include a housing having another stepped terrace. This other stepped terrace may include a sequence of steps in the vertical direction, which are offset from each other in the horizontal direction. Furthermore, the housing may be configured to mate with the set of semiconductor dies such that the set of semiconductor dies are arranged in the stack in the vertical direction. For example, the other stepped terrace may approximately be a mirror image of the stepped terrace.

By facilitating assembly of the chip package, the assembly component and the assembly techniques may enable low-cost, high-throughput manufacturing of a high-performance chip package (such as a chip package with high-bandwidth interconnects). In particular, these embodiments may facilitate reduced mechanical errors during assembly of the chip package, and a chip package that is more tolerant of mechanical variations in sizes and positions of components in the chip package. For example, using these embodiments the set of semiconductor dies may be assembled in the chip package with a total vertical position error over the stack that is less than the vertical position errors (which are sometimes referred to as 'vertical errors') associated with the semiconductor dies and the adhesive layers between the semiconductor dies. This may be achieved by independently referencing each semiconductor die to the assembly component (instead of mechanically referencing a given semiconductor die in the stack to an immediately preceding semiconductor die during assembly). Thus, the assembly component and the associated assembly technique may prevent the individual vertical position errors from being compounded. Alternatively, in stacks that have a small number of semiconductor dies (such as those where a compounded total vertical position error associated with the stack is not prohibitive), the other assembly technique may be used to assemble the chip package without using the assembly component.

Figure 1:
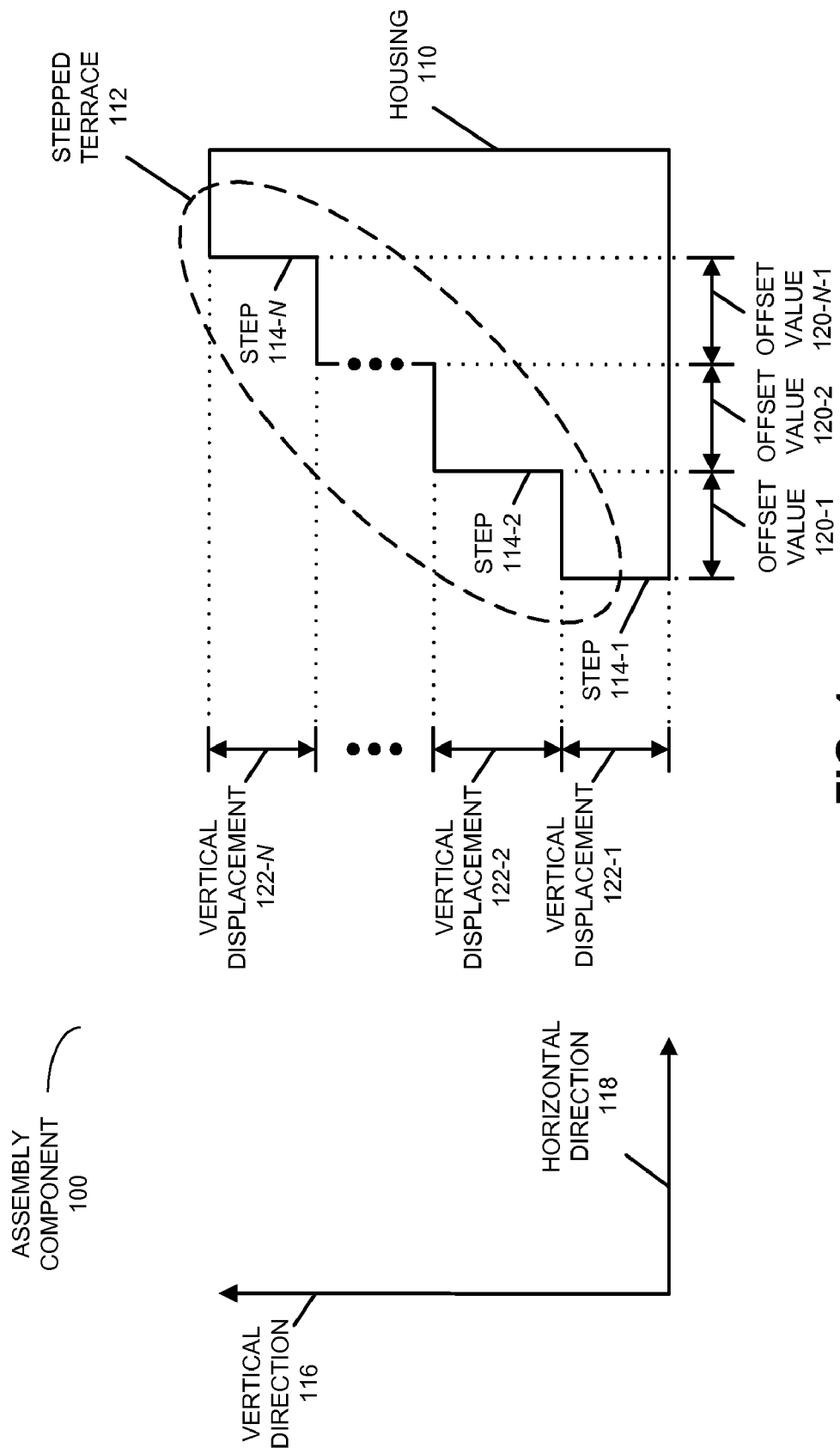
FIG. 1 is a block diagram illustrating an assembly component for assembling a chip package in accordance with an embodiment of the present disclosure.

We now describe embodiments of the assembly component and the chip package. FIG. 1 presents a block diagram illustrating an assembly component 100 that can be used to position and secure semiconductor dies (or chips) during assembly of a chip package (such as chip package 300 in FIGs. and 4, which is sometimes referred to as a 'ramp-stack chip package'). This assembly component includes a housing 110 having a stepped terrace 112. Moreover, this stepped terrace includes a sequence of steps 114 in a vertical direction 116. Note that each step after step 114-1 is offset in a horizontal direction 118 by an associated one of offset values 120 from an immediately preceding step in the sequence of steps 114. Furthermore, offset values 120 may each have approximately a constant value for the sequence of steps 114 or may vary over the sequence of steps 114 (i.e., the offset values for different steps 114 in stepped terrace 112 may be different). Additionally, vertical displacements 122 associated with the sequence of steps 114 (other than those for step 114-1 or step 114-N) may each have approximately a constant value or may vary over the sequence of steps 114 (i.e., the vertical displacements for different steps 114 in stepped terrace 112 may be different).

Figure 2:
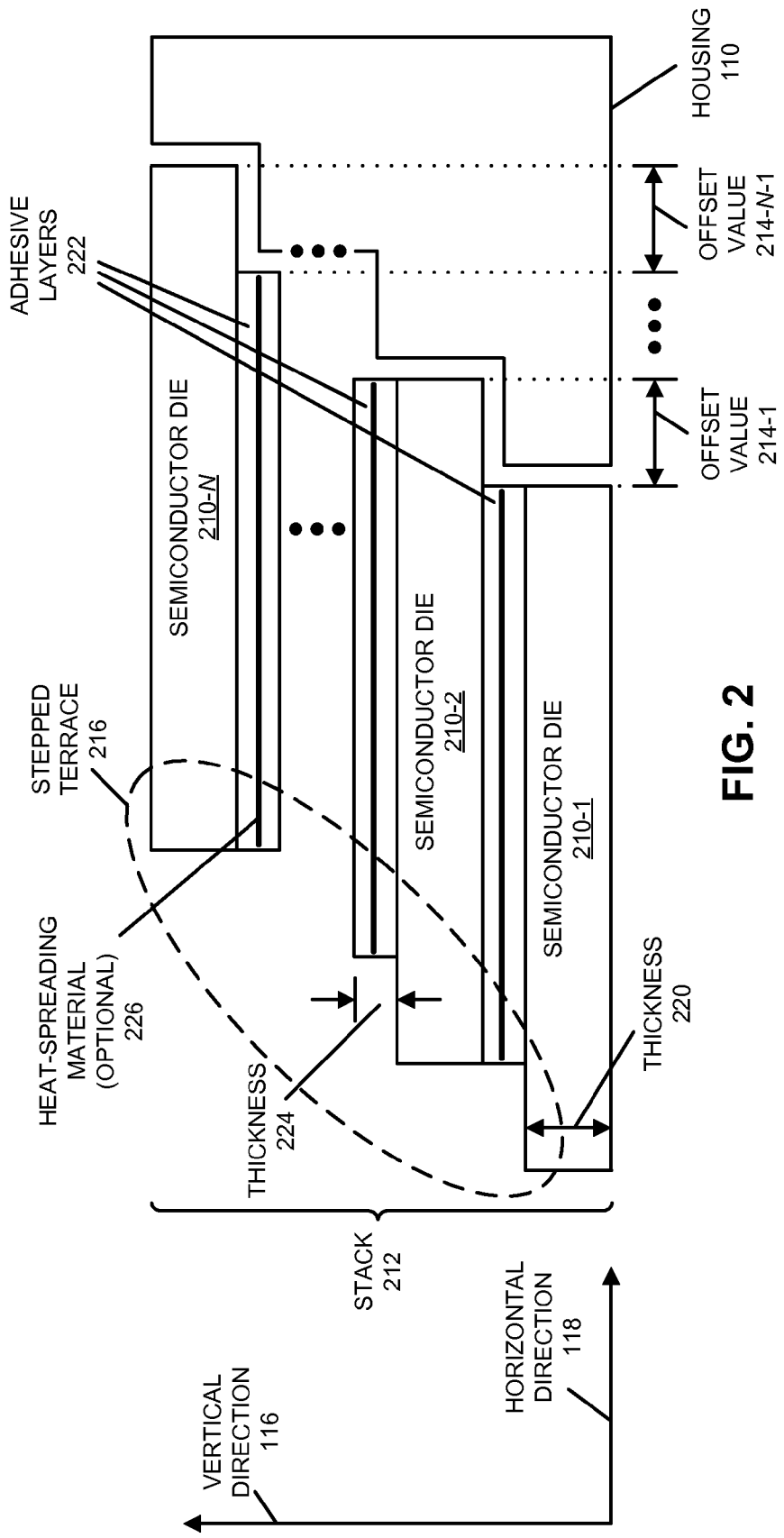
FIG. 2 is a block diagram illustrating assembly of the chip package using the assembly component of FIG. 1 in accordance with an embodiment of the present disclosure.

As shown in FIG. 2, which presents a block diagram illustrating assembly of the chip package using this assembly component, housing 110 may be configured to mate with a set of semiconductor dies 210 such that the set of semiconductor dies 210 are arranged in a stack 212 in vertical direction 116. Note that vertical direction 116 is substantially perpendicular to semiconductor die 210-1 in stack 212 (and, thus, with horizontal direction 118). Additionally, each semiconductor die, after semiconductor die 210-1, may be offset in horizontal direction 118 by an associated one of offset values 214 from an immediately preceding semiconductor die in stack 212, thereby defining a stepped terrace 216 at one side of stack 212. These offset values may have approximately a constant value for the set of semiconductor dies 210 or may vary over the set of semiconductor dies 210 (i.e., the offset values for different steps in stepped terrace 216 may be different).

Figure 3:
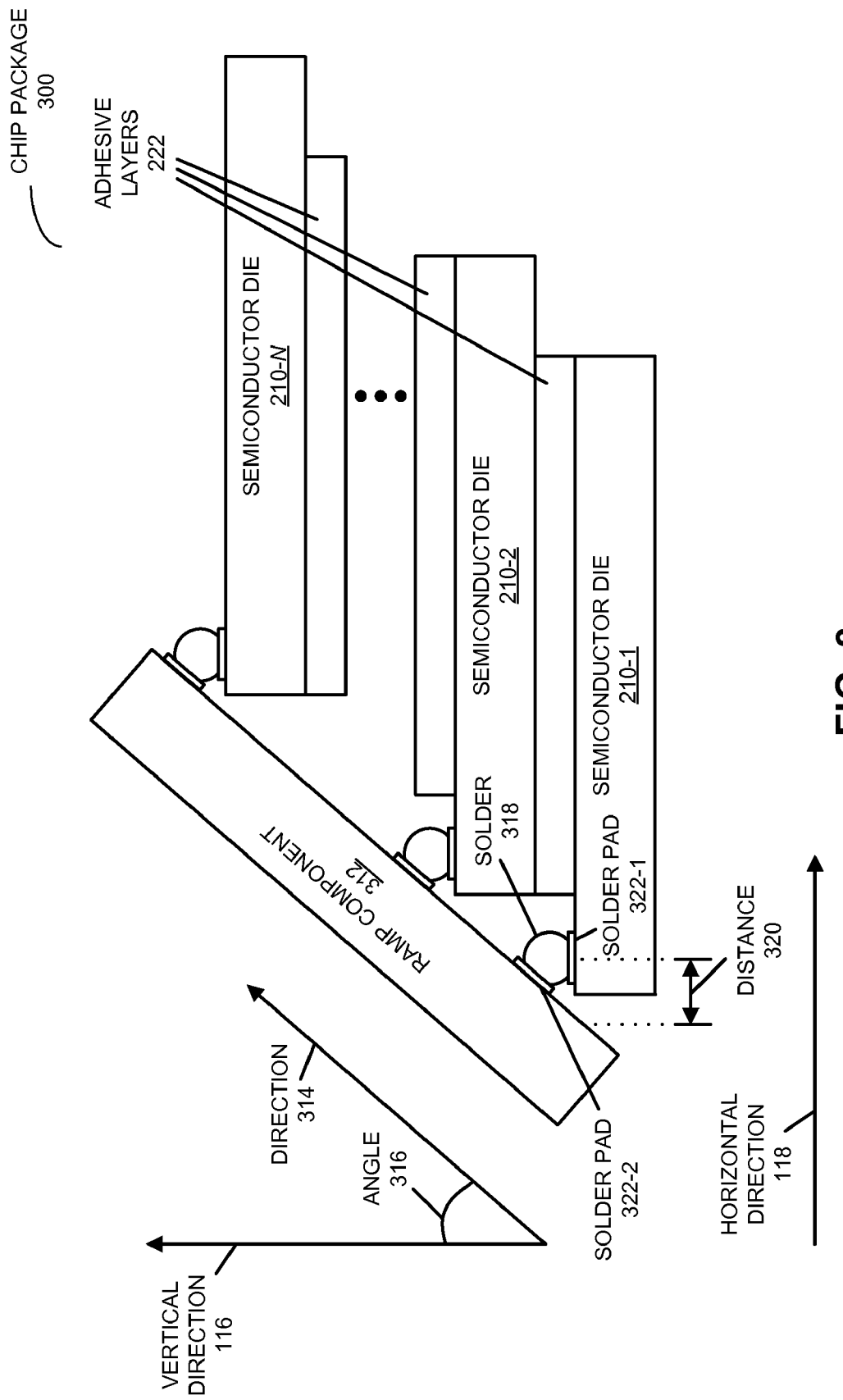
FIG. 3 is a block diagram illustrating a side view of the assembled chip package in accordance with an embodiment of the present disclosure.

Moreover, as shown in FIG. 3, which presents a block diagram illustrating a side view of assembled chip package 300, assembly component 100 (FIG. 1) may facilitate assembly of chip package 300 in which: high-bandwidth ramp component 312 is rigidly mechanically and electrically coupled to semiconductor dies 210, thereby facilitating communication between semiconductor dies 210 and supplying power to semiconductor dies 210; ramp component 312 is positioned on the one side of stack 212 (FIG. 2); and ramp component 312 is approximately parallel to a direction 314 (at angle 316) along stepped terrace 216 (FIG. 2), which is between horizontal direction 118 and vertical direction 116.

Referring back to FIG. 2, to facilitate the assembly stepped terrace 112 (FIG. 1) may approximately be a mirror image of stepped terrace 216 (FIG. 2). Furthermore, a given semiconductor die in the set of semiconductor dies 210 may have a nominal thickness 220, and a vertical displacement of a given step in sequence of steps 114 may be larger than nominal thickness 220 (or it may be larger than a maximum thickness of any of semiconductor dies 210). However, note that in some embodiments the thickness of at least some of semiconductor dies 210 in stack 212 may be different (for example, the thicknesses may vary over stack 212).

In an exemplary embodiment, vertical displacements 122 may each be 160 µm versus nominal thickness 220 of 150±5 µm. (However, in other embodiments thickness 220 may be between 30 and 250 µm.) This additional vertical displacement relative to thickness 220 may allow the adhesive in adhesive layers 222 to spread during assembly. Note that for nominal thickness 220 of 150 µm, angle 316 (FIG. 3) may be between 15 and 20°. In general, nominal thickness 220 depends, in part, on the number of semiconductor dies 210 in stack 212. Furthermore, note that a nominal thickness 224 of adhesive layers 222 may be 10 µm. (However, in other embodiments the thickness of adhesive layers 222 may vary along vertical direction 116 in stack 212.)

Additionally, the offset value at a given step in stepped terrace 112 (FIG. 1) may be the same or larger than the associated offset value in stepped terrace 216. In general, offset values 120 (FIG. 1) and offset values 214 may be determined based on direction 314 (or angle 316) in FIG. 3 and a nominal thickness of solder (such as solder ball 318 in FIG. 3) used to rigidly mechanically couple ramp component 312 (FIG. 3) to set of semiconductor dies 210. Note that the thickness of the solder may be approximately constant over stack 212 or may vary over the stack (i.e., along vertical direction 116).

In some embodiments, assembly component 100 (FIG. 1) facilitates assembly of the set of semiconductor dies 210 with an accumulated position error over the set of semiconductor dies 210 in vertical direction 116 (i.e., an accumulated position error in the vertical positions of semiconductor dies over stack 212) that is less than a sum of vertical errors associated with the set of semiconductor dies 210 and adhesive layers 222 (such as an epoxy or glue that cures in 10 s at 150 C) between the semiconductor dies 210. For example, the accumulated position error may be associated with: thickness variation of the semiconductor dies 210, thickness variation of adhesive layers 222; and/or thickness variation of an optional heat-spreading material 226 (such as pressed graphite fibers) in at least some of adhesive layers 222. In some embodiments, the accumulated position error may be less than 1 µm, and may be as small as 0 µm. Additionally, assembly component 100 (FIG. 1) may facilitate assembly of the set of semiconductor dies 210 with a maximum position error (i.e., a maximum error in distance 320 in FIG. 3), which is associated with edge variation of semiconductor dies 210 (such as a variation in the saw-line position), that is less than a predefined value (for example, the maximum position error may be less than 1 µm, and may be as small as 0 µm). As described further below with reference to FIG. 5, this may be accomplished by using a pick-and-place tool to assemble chip package 300 (FIG. 3) using optical alignment markers (such as fiducial markers) on semiconductor dies 210 such that distance 320 (FIG. 3) is measured relative to a center of a saw lane for semiconductor dies 210. (Alternatively or additionally, in some embodiments assembly component 100 in FIG. 1 includes mechanical stops, such as mechanical stops fabricated using polyimide, and semiconductor dies 210 may be pushed up against these mechanical stops during assembly of chip package 300 in FIG. 3, thereby facilitating desired tolerances in horizontal direction 118 and/or vertical direction 116.)

Referring back to FIG. 3, note that in order to accommodate mechanical alignment errors in vertical direction 116, the height and pitch of the solder bumps or pads (such as solder pad 322-1 and/or solder pad 322-2) and/or solder 318 may vary between at least some of semiconductor dies 210 along vertical direction 116. For example, distance 320 (i.e., the position of solder pad 322-1 relative to a center of a saw lane for semiconductor die 210-1) may be 60 µm and solder pads 322 may each have an 80 µm width. Furthermore, the solder balls (such as solder ball 318) may have a diameter of 120 µm prior to reflowing or melting, and an approximate thickness between 40 and 60 µm after melting. In some embodiments, two or more rows of solder balls may rigidly couple ramp component 312 to a given semiconductor die.

Figure 4:
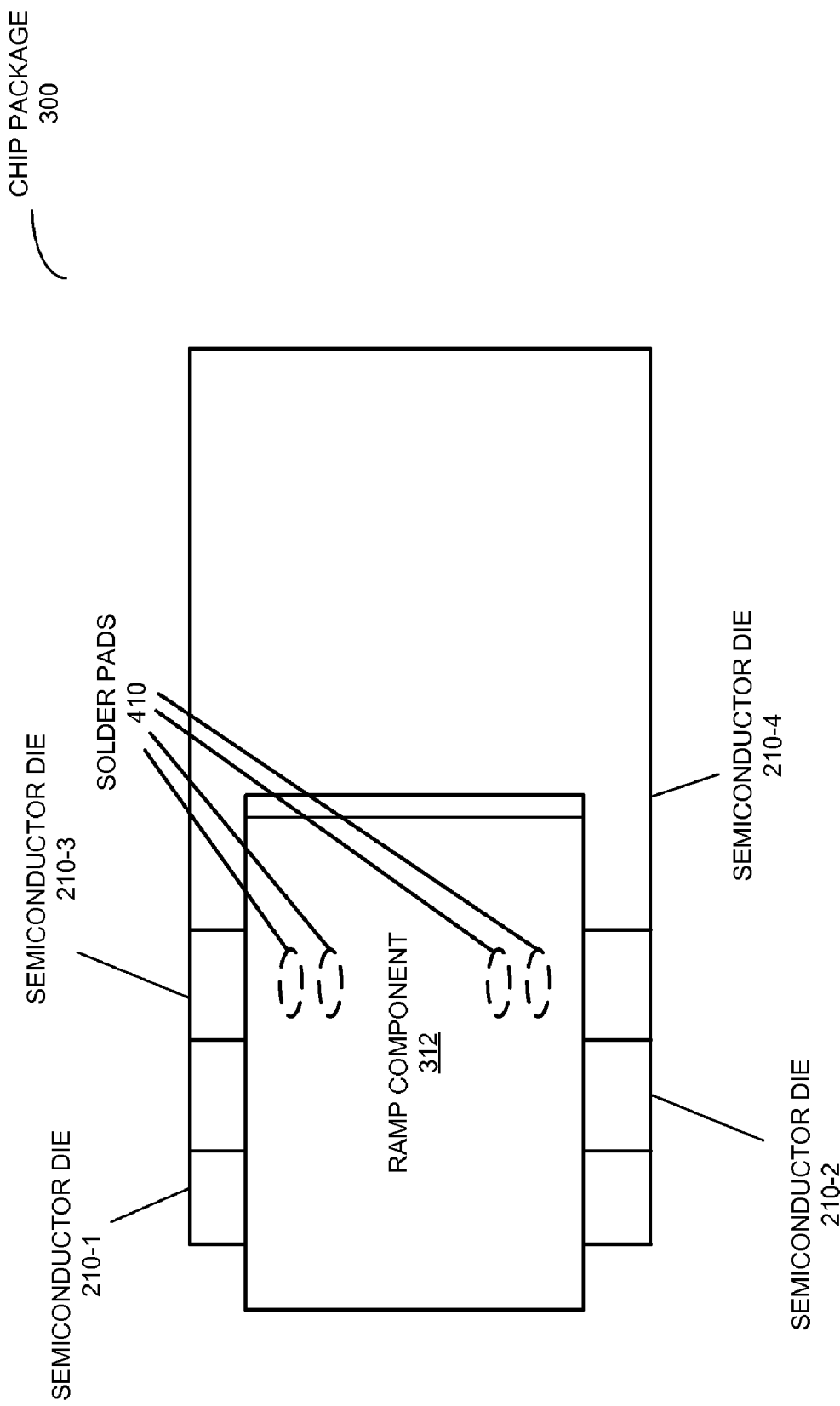
FIG. 4 is a block diagram illustrating a top view of the assembled chip package in accordance with an embodiment of the present disclosure.

FIG. 4 presents a block diagram illustrating a top view of assembled chip package 300 in which stack 212 (FIG. 2) includes four semiconductor dies 210. This view of chip package 300 illustrates that in some embodiments solder pads 410 may have non-rectangular shapes. For example, solder pads 410 may have oblong shapes, such as those that are 80 µm wide and 120 µm long. These solder-pad shapes on semiconductor dies 210 and/or ramp component 312 may tolerate some horizontal and/or vertical position errors.

In some embodiments, the solder pads can be moved to an edge of ramp component 312. This may facilitate a perpendicular orientation (i.e., angle 316 in FIG. 3 may be 0°). This configuration may facilitate a memory module in which contacts or pads associated with input/output (I/O) signal lines and power lines are at the edge of the ramp component (instead of down the 'spine'). In this way, a number of diffusion layers in the ramp component may be reduced. For example, there may be 60 contacts or pads along an edge of ramp component 312 in this memory module.

By allowing the stacking process during assembly of chip package 300 to be referenced to assembly component 100 in FIG. 1 (as opposed to the immediately preceding semiconductor die in stack 212 in FIG. 2), this assembly component can effectively reduce horizontal and/or vertical position errors associated with mechanical variations in the sizes and thicknesses of components in chip package 300. Thus, assembly component 100 in FIG. 1 may facilitate highly accurate and high-yield assembly of chip package 300. Furthermore, because this assembly component also facilitates the use of high-volume and low-cost manufacturing techniques, such as a pick-and-place tool, it can greatly reduce the cost of chip package 300.

In addition, the ability to assemble low-cost, high-yield chip packages may facilitate high-performance devices. For example, in some embodiments a ramp-stack chip package (such as chip package 300) is included in a dual in-line memory module. For example, there may be up to 80 memory devices (such as dynamic random access memory or another type of memory-storage device) in the ramp-stack chip package. If needed, 'bad' or faulty memory devices can be disabled. Thus, 72 memory devices (out of 80) may be used. Furthermore, this configuration may expose the full bandwidth of the memory devices in the memory module, such that there is little or no latency delay in accessing any of the memory devices.

Alternatively, the dual in-line memory module may include multiple fields that each can include a ramp-stack chip package. For example, there may be four ramp-stack chip packages (which each include nine memory devices) in a dual in-line memory module.

In some embodiments, one or more of these dual in-line memory modules (which can include one or more ramp-stack chip packages) may be coupled to a processor. For example, the processor may be coupled to the one or more dual in-line memory modules using capacitive proximity communication (PxC) of capacitively coupled signals. In turn, the processor may be mounted on a substrate using C4 solder balls.

Figure 5:
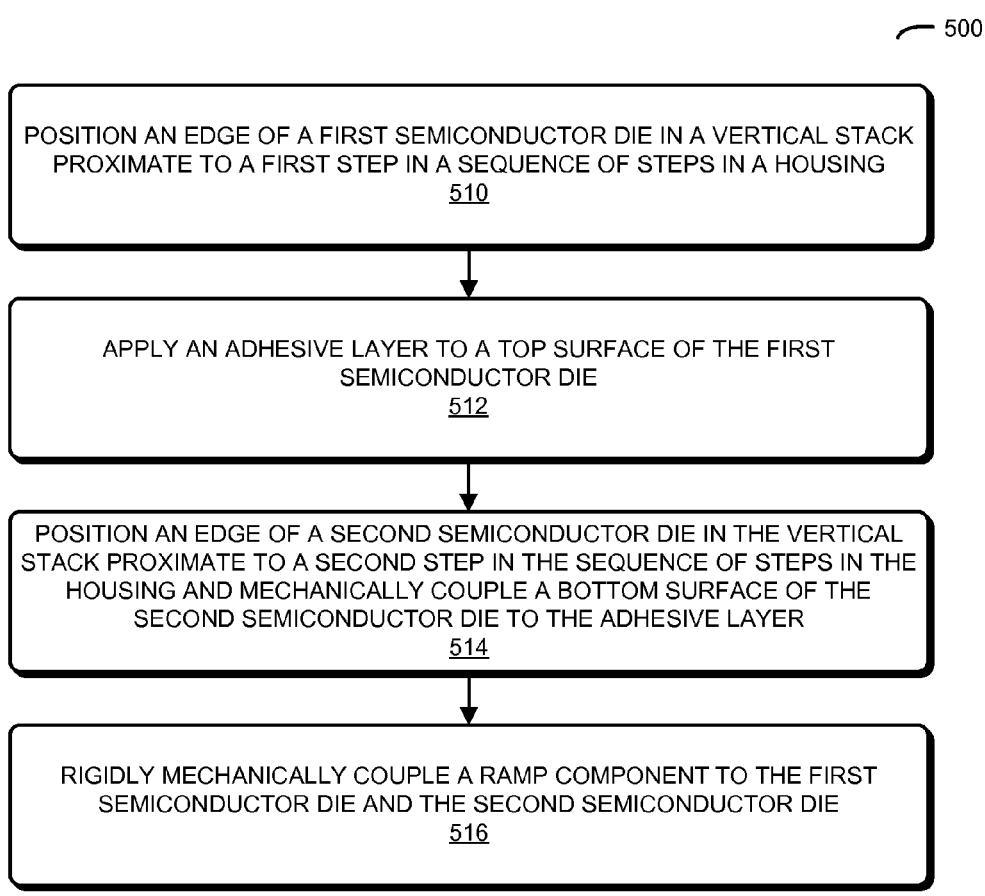
FIG. 5 is a flow diagram illustrating a method for assembling the chip package using the assembly component of FIG. 1 in accordance with an embodiment of the present disclosure.

We now describe embodiments of the assembly techniques. FIG. 5 presents a flow diagram illustrating a method 500 for assembling a chip package using assembly component 100 (FIG. 1). During this method, an edge of a first semiconductor die in a vertical stack of semiconductor dies is positioned proximate to a first step in a sequence of steps in a first stepped terrace in a vertical direction of a housing (operation 510), such as a housing in an assembly component. Note that the vertical direction is substantially perpendicular to the first semiconductor die. Then, an adhesive layer is applied to a top surface of the first semiconductor die (operation 512).

Moreover, an edge of a second semiconductor die in the vertical stack of semiconductor dies is positioned proximate to a second step in the sequence of steps in the vertical direction of the housing, and a bottom surface of the second semiconductor die is mechanically coupled to the adhesive layer (operation 514). Note that the second step is offset in a horizontal direction by a first offset value from the first step, and the second semiconductor die is offset in the horizontal direction by a second offset value, thereby defining a second stepped terrace at one side of the vertical stack. Furthermore, a ramp component is rigidly mechanically coupled to the first semiconductor die and the second semiconductor die (operation 516), where the ramp component is positioned on the one side of the vertical stack, and where the ramp component is approximately parallel to a direction along the second stepped terrace, which is between the horizontal direction and the vertical direction.

Note that positioning a given semiconductor die, which can be one of the first semiconductor die and the second semiconductor die, may involve a pick-and-place tool. In an exemplary embodiment, the horizontal and/or the vertical alignment is within 1-10 µm. Furthermore, this positioning may be based on optical alignment markers on the given semiconductor die. For example, optical alignment markers may include fiducial markers.

Additionally, rigidly mechanically coupling the ramp component to the first semiconductor die and the second semiconductor die may involve melting solder on: the ramp component and/or the first semiconductor die and the second semiconductor die. When reflowing the solder, the ramp component may be placed on the stack or vice versa. This may allow the weight of the ramp component (or the stack of semiconductor dies) to help overcome the surface tension of the solder.

Note that, when rigidly mechanically coupling the ramp component to the first semiconductor die and the second semiconductor die, a compressive force may be applied in the vertical direction. This may ensure that the assembled chip package has a desired height. In some embodiments, a compressive force is applied along a normal to the ramp component. Either of these compressive forces may improve heat transfer within the stack, for example, by filling or reducing gaps between components in the chip package.

While method 500 illustrates the use of assembly component 100 (FIG. 1), in other embodiments chip package 300 (FIGS. 3 and 4) is assembled without using assembly component 100 (FIG. 1). This may be possible in chip packages that have a few semiconductor dies (or less) and which are, therefore, less sensitive to accumulated position errors.

Figure 6:
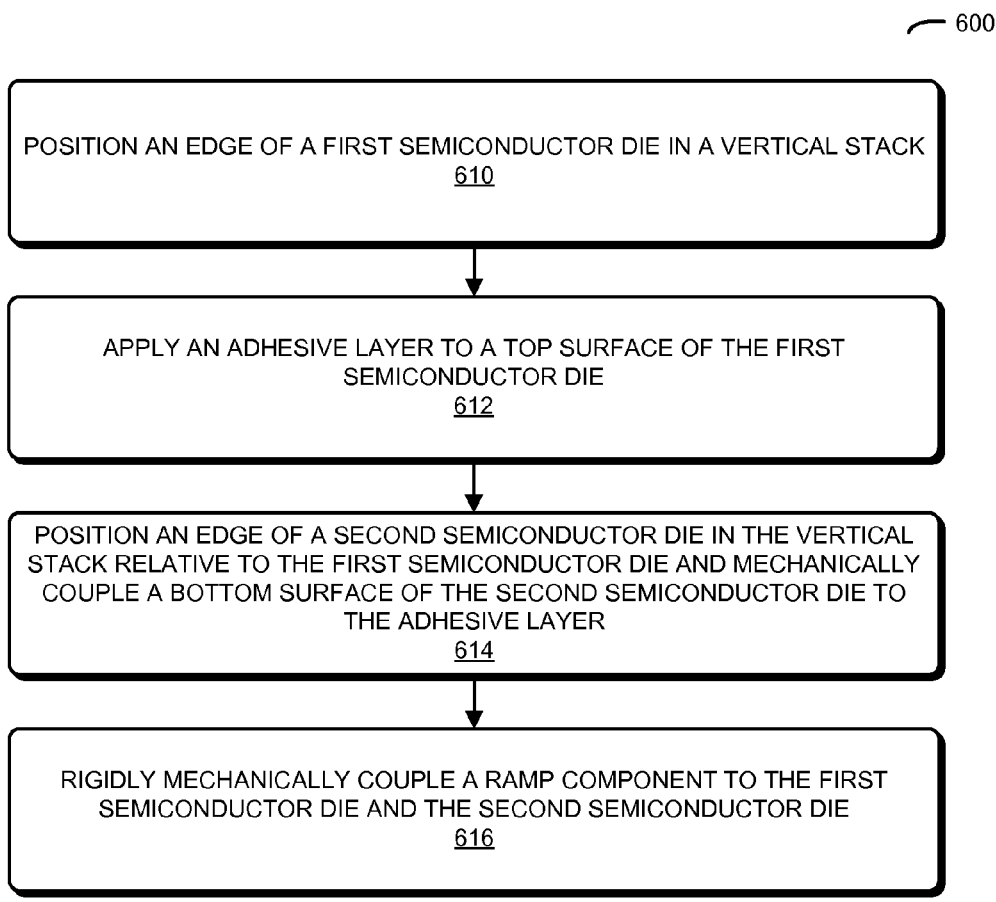
FIG. 6 is a flow diagram illustrating a method for assembling the chip package without using the assembly component of FIG. 1 in accordance with an embodiment of the present disclosure.

A corresponding assembly technique is shown in FIG. 6, which presents a flow diagram illustrating a method 600 for assembling the chip package without using assembly component 100 (FIG. 1). During this method, the first semiconductor die is positioned in the vertical stack of semiconductor dies (operation 610), where the vertical stack is along the vertical direction that is substantially perpendicular to the first semiconductor die. Then, the adhesive layer is applied to the top surface of the first semiconductor die (operation 612). Moreover, the edge of the second semiconductor die in the vertical stack of semiconductor dies is positioned relative to the first semiconductor die (operation 614), where the bottom surface of the second semiconductor die is mechanically coupled to the adhesive layer, and where the second semiconductor die is offset in the horizontal direction by the offset value, thereby defining a stepped terrace at one side of the vertical stack. Furthermore, the ramp component is rigidly mechanically coupled to the first semiconductor die and the second semiconductor die (operation 616), where the ramp component is positioned on the one side of the vertical stack, and wherein the ramp component is approximately parallel to a direction along the stepped terrace, which is between the horizontal direction and the vertical direction.

In some embodiments of methods 500 (FIG. 5) and 600, there may be additional or fewer operations. For example, the stack may be assembled in pieces that include a subset of the semiconductor dies, which are subsequently combined into a full stack. Moreover, the order of the operations may be changed, and/or two or more operations may be combined into a single operation.

Note that assembly component 100 (FIG. 1) and chip package 300 (FIGS. 3 and 4) may include fewer components or additional components. For example, there may be breaks defined in a stack of semiconductor dies in a ramp-stack chip package, such as by not including solder pads for one or more of the semiconductor dies on the ramp component. Moreover, although these devices and systems are illustrated as having a number of discrete items, these embodiments are intended to be functional descriptions of the various features that may be present rather than structural schematics of the embodiments described herein. Consequently, in these embodiments, two or more components may be combined into a single component and/or a position of one or more components may be changed.

While the preceding embodiments use semiconductor dies (such as silicon) in the chip package, in other embodiments a different material than a semiconductor may be used as the substrate material in one or more of these chips. However, in embodiments in which silicon is used, semiconductor dies 210 (FIGS. 2-4) may be fabricated using standard silicon processing. These semiconductor dies may provide silicon area that supports logic and/or memory functionality.

Furthermore, in FIG. 3 ramp component 312 may be a passive component, such as a plastic substrate with metal traces to electrically couple to semiconductor dies 210. For example, ramp component 312 may be fabricated using injection-molded plastic. Alternatively, ramp component 312 may be another semiconductor die with lithographically defined wires or signal lines. In embodiments where ramp component 312 includes a semiconductor die, active devices, such as limit amplifiers, may be included to reduce cross-talk between the signal lines. Additionally, cross-talk may be reduced in either an active or a passive ramp component 312 using differential signaling.

In some embodiments, ramp component 312 includes transistors and wires that shuttle data and power signals among semiconductor dies 210 via solder balls (such as solder ball 318). For example, ramp component 312 may include high-voltage signals. These signals may be stepped down for use on semiconductor dies 210 using: a step-down regulator (such as a capacitor-to-capacitor step-down regulator), as well as capacitor and/or inductor discrete components to couple to semiconductor dies 210.

Additionally, ramp component 312 may include a buffer or logic chip for memory, and/or I/O connectors to external device(s) and/or system(s). For example, the I/O connectors may include one or more: ball bonds, wire bonds, edge connectors and/or PxC connectors for coupling to external devices. In some embodiments, these I/O connectors may be on a back surface of ramp component 312, and ramp component 312 may include one or more through-silicon vias (TSVs) that couple the I/O connectors to solder pads, such as solder pad 322-2.

In some embodiments, ramp component 312 and semiconductor dies 210 in chip package 300 are mounted on an optional substrate (such as a printed circuit board or a semiconductor die). This optional substrate may include: ball bonds, wire bonds, edge connectors and/or PxC connectors for coupling to external devices. If these I/O connectors are on a back surface of the optional substrate, the optional substrate may include one or more TSVs.

While solder balls are used in the preceding embodiments as an illustration of the electrical and mechanical coupling of ramp component 312 and semiconductor dies 210, in other embodiments these components may be electrically and/or mechanically coupled using other techniques, such as: microsprings, micro-spheres (in a ball-in-pit configuration described below), and/or an anisotropic film (such as an anisotropic elastomer film, which is sometimes referred to as an 'anisotropic conductive film').

In embodiments where components in chip packages communicate with PxC of electromagnetically coupled signals (such as PxC between: ramp component 312 and semiconductor dies 210, ramp component 312 and an external device, ramp component 312 and optional substrate, optional substrate and semiconductor dies 210 and/or optional substrate and the external device), the PxC may include: communication of capacitively coupled signals (which is referred to as 'electrical proximity communication'), communication of optically coupled signals (which is referred to as 'optical proximity communication'), communication of electromagnetically coupled signals (which is referred to as 'electromagnetic proximity communication'), communication of inductively coupled signals, and/or communication of conductively coupled signals.

In general, the impedance of the resulting electrical contacts may be conductive and/or capacitive, i.e., may have a complex impedance that includes an in-phase component and/or an out-of-phase component. Regardless of the electrical contact mechanism (such as solder, microsprings, an anisotropic layer, etc.), if the impedance associated with the contacts is conductive, conventional transmit and receive I/O circuits may be used in components in chip package 300. However, for contacts having a complex (and, possibly, variable) impedance, the transmit and receive I/O circuits may include one or more embodiments described in U.S. patent application Ser. No. 12/425,871, entitled "Receive Circuit for Connectors with Variable Complex Impedance," by Robert J. Drost et al., Attorney Docket Number SUN09-0285, filed on Apr. 17, 2009, the contents of which are incorporated herein by reference.

Note that packaging techniques that allow some rework are more cost-effective when faced with lower semiconductor-die yields or high expense to test extensively before packaging and assembly. Therefore, in embodiments where the mechanical and/or electrical coupling between semiconductor dies 210 and ramp component 312 are remateable, the yield of chip package 300 may be increased by allowing rework (such as replacing a bad chip that is identified during assembly, testing or burn-in). In this regard, remateable mechanical or electrical coupling should be understood to be mechanical or electrical coupling that can be established and broken repeatedly (i.e., two or more times) without requiring rework or heating (such as with solder). In some embodiments, the remateable mechanical or electrical coupling involves male and female components designed to couple to each other (such as components that snap together).

While FIG. 3 illustrates a particular configuration of chip package 300, a number of techniques and configurations may be used to implement mechanical alignment and assembly with or without using assembly component 100 (FIG. 1). For example, semiconductor dies 210 and/or ramp component 312 may be positioned relative to each other using a ball-and-pit alignment technique (and, more generally, a positive-feature-in-negative-feature alignment technique). In particular, balls may be positioned into etch pits to relatively align components, such as semiconductor dies 210 in stack 212 (FIG. 2). Other examples of positive features include hemisphere-shaped bumps. However, any combination of mechanically locking positive and negative surface features on components in chip package 300 may be used to align and/or assemble chip package 300.

Referring to FIG. 2, as noted previously in some embodiments optional heat-spreading material 226 (FIG. 2) (and, more generally, an intermediate material between semiconductor dies 210 that has a high thermal conductivity) may help remove heat generated during operation of circuits on one or more semiconductor dies 210 and/or ramp component 312 (FIGS. 3 and 4). This thermal management may include any of the following thermal paths: a first thermal path in a plane of semiconductor dies 210; a second thermal path in a plane of adhesive layers 222; and/or a third thermal path in a plane of optional heat-spreading material 226. In particular, the thermal flux associated with these thermal paths may be managed independently of each other via thermal coupling at an edge of the chip package. Note that this thermal management may include the use of: phase change cooling, immersion cooling, and/or a cold plate. Also note that the thermal flux associated with the first thermal path that diffuses through the cross-sectional area at the edge of the chip package is a function of nominal thickness 220. Thus, the thermal management may be different in chip packages with larger or smaller nominal thicknesses of semiconductor dies 210.

Note that there may be optional encapsulation around at least a portion of chip package 300 (FIGS. 3 and 4). Additionally, air gaps between components in chip package 300 (FIGS. 3 and 4) may be underfilled to improve heat removal. This may be facilitated by decreasing angle 316 in FIG. 3, i.e., semiconductor dies 210 may be tipped more toward vertical direction 116.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An assembly component, comprising a housing that includes a first stepped terrace, wherein the first stepped terrace includes a sequence of steps in a vertical direction,
    wherein each step after a first step in the sequence of steps is offset in a horizontal direction by a first offset value from an immediately preceding step in the sequence of steps,
    wherein the housing is configured to mate with a set of semiconductor dies such that the set of semiconductor dies are arranged in a stack in the vertical direction, which is substantially perpendicular to a first semiconductor die in the vertical stack,
    wherein each semiconductor die, after the first semiconductor die, is offset in the horizontal direction by a second offset value from an immediately preceding semiconductor die in the vertical stack, thereby defining a second stepped terrace at one side of the vertical stack, and
    wherein each semiconductor die comprises a solder pad on a surface of the semiconductor die that is parallel to the horizontal direction and is on the second stepped terrace, and wherein a ramp component that is approximately parallel to a direction along the second stepped terrace is rigidly coupled to each semiconductor die using a corresponding one of the solder pads.

2. The assembly component of claim 1, wherein the first stepped terrace is approximately a mirror image of the second stepped terrace.

3. The assembly component of claim 1, wherein a given semiconductor die in the set of semiconductor dies has a nominal thickness; and
    wherein a vertical displacement of a given step in the sequence of steps is larger than the nominal thickness.

4. The assembly component of claim 1, wherein the first offset value is larger than the second offset value.

5. The assembly component of claim 1, wherein the assembly component facilitates assembly of a chip package,
    wherein the ramp component is positioned on the one side of the vertical stack, and
    wherein the direction along the second stepped terrace is between the horizontal direction and the vertical direction.

6. The assembly component of claim 5, wherein the first offset value and the second offset value are determined based on the direction and a nominal thickness of solder used to rigidly mechanically couple the ramp component to the set of semiconductor dies.

7. The assembly component of claim 1, wherein the assembly component facilitates assembly of the set of semiconductor dies with an accumulated position error over the set of semiconductor dies in the vertical direction that is less than a sum of vertical errors associated with the set of semiconductor dies and a set of adhesive layers between the semiconductor dies.

8. The assembly component of claim 7, wherein the accumulated position error is associated with thickness variation of the semiconductor dies.

9. The assembly component of claim 7, wherein the accumulated position error is associated with thickness variation of the set of adhesive layers.

10. The assembly component of claim 7, wherein the accumulated position error is associated with thickness variation of a heat-spreading material in the set of adhesive layers.

11. The assembly component of claim 1, wherein the assembly component facilitates assembly of the set of semiconductor dies with a maximum position error associated with edge variation of the semiconductor dies that is less than a predefined value.

12. A method for assembling a chip package, comprising:
    positioning an edge of a first semiconductor die in a vertical stack of semiconductor dies proximate to a first step in a sequence of steps in a first stepped terrace in a vertical direction of a housing, wherein the vertical direction is substantially perpendicular to the first semiconductor die;
    applying an adhesive layer to a top surface of the first semiconductor die;
    positioning an edge of a second semiconductor die in the vertical stack of semiconductor dies proximate to a second step in the sequence of steps in the vertical direction of the housing, wherein a bottom surface of the second semiconductor die is mechanically coupled to the adhesive layer, wherein the second step is offset in a horizontal direction by a first offset value from the first step, and wherein the second semiconductor die is offset in the horizontal direction by a second offset value, thereby defining a second stepped terrace at one side of the vertical stack; and
    rigidly mechanically coupling a ramp component to the first semiconductor die and the second semiconductor die, wherein the ramp component is positioned on the one side of the vertical stack, and
    wherein the ramp component is approximately parallel to a direction along the second stepped terrace, which is between the horizontal direction and the vertical direction.

13. The method of claim 12, wherein positioning a given semiconductor die, which can be one of the first semiconductor die and the second semiconductor die, involves a pick-and-place tool.

14. The method of claim 12, wherein positioning a given semiconductor die, which can be one of the first semiconductor die and the second semiconductor die, is based on optical alignment markers on the given semiconductor die.

15. The method of claim 12, wherein the adhesive layer includes a heat-spreading material that preferentially conducts heat in a plane of a given semiconductor die.

16. The method of claim 12, wherein rigidly mechanically coupling the ramp component to the first semiconductor die and the second semiconductor die involves melting solder on one of: the ramp component, the first semiconductor die and the second semiconductor die, and both the ramp component and the first semiconductor die and the second semiconductor die.

17. The method of claim 12, wherein rigidly mechanically coupling the ramp component to the first semiconductor die and the second semiconductor die involves applying a compressive force in the vertical direction.

18. The method of claim 12, wherein the first stepped terrace is approximately a mirror image of the second stepped terrace.

19. The method of claim 12, wherein a given semiconductor die, which can be one of the first semiconductor die and the second semiconductor die, has a nominal thickness; and
   wherein a vertical displacement of a given step in the sequence of steps is larger than the nominal thickness.

20. A method for assembling a chip package, comprising:
positioning a first semiconductor die in a vertical stack of semiconductor dies, wherein the vertical stack is along a vertical direction that is substantially perpendicular to the first semiconductor die;
applying an adhesive layer to a top surface of the first semiconductor die;
positioning an edge of a second semiconductor die in the vertical stack of semiconductor dies relative to the first semiconductor die, wherein a bottom surface of the second semiconductor die is mechanically coupled to the adhesive layer, and wherein the second semiconductor die is offset in a horizontal direction by an offset value, thereby defining a stepped terrace at one side of the vertical stack; and
rigidly mechanically coupling a ramp component to the first semiconductor die and the second semiconductor die, wherein the ramp component is positioned on the one side of the vertical stack, and
wherein the ramp component is approximately parallel to a direction along the stepped terrace, which is between the horizontal direction and the vertical direction.

* * * * *